(12) United States Patent
Wang

(10) Patent No.: US 11,621,166 B2
(45) Date of Patent: Apr. 4, 2023

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Nan Wang, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 210 days.

(21) Appl. No.: 16/878,984

(22) Filed: May 20, 2020

(65) Prior Publication Data
US 2020/0373161 A1   Nov. 26, 2020

(30) Foreign Application Priority Data

May 23, 2019   (CN) .......................... 201910436383.X

(51) Int. Cl.
*H01L 21/033* (2006.01)
*H01L 21/8238* (2006.01)

(52) U.S. Cl.
CPC ...... *H01L 21/0338* (2013.01); *H01L 21/0332* (2013.01); *H01L 21/0335* (2013.01); *H01L 21/0337* (2013.01); *H01L 21/823821* (2013.01)

(58) Field of Classification Search
CPC ............ H01L 21/0332; H01L 21/0335; H01L 21/0337; H01L 21/0338
See application file for complete search history.

(56) References Cited

U.S. PATENT DOCUMENTS

| 9,620,380 B1* | 4/2017 | Dai ...................... H01L 21/0338 |
| 2014/0083972 A1* | 3/2014 | Oyama ............... H01L 21/0337 216/13 |
| 2015/0294976 A1* | 10/2015 | Kim .................... H01L 27/1116 438/702 |
| 2020/0058514 A1* | 2/2020 | Wang ................ H01J 37/32422 |

* cited by examiner

*Primary Examiner* — Walter H Swanson
(74) *Attorney, Agent, or Firm* — Anova Law Group, PLLC

(57) ABSTRACT

A semiconductor device and a method for forming the semiconductor device are provided. The method includes providing a substrate, and forming a first core layer on the substrate. The substrate includes a pull-up transistor region. The method also includes forming separately arranged second core layers on the first core layer, and forming a first sacrificial sidewall spacer on a sidewall of a second core layer. A gap is formed between adjacent first sacrificial sidewall spacers over the pull-up transistor region. In addition, the method includes removing the second core layers, and then etching the first core layer using the first sacrificial sidewall spacers as a mask until the substrate is exposed. The gap is transferred to a region between adjacent etched first core layers over the pull-up transistor region. Further, after etching the first core layer, the method includes forming a dielectric layer to fully fill the gap.

15 Claims, 9 Drawing Sheets

SEMICONDUCTOR DEVICE AND FABRICATION METHOD THEREOF

CROSS-REFERENCES TO RELATED APPLICATIONS

This application claims the priority of Chinese patent application No. 201910436383.X, filed on May 23, 2019, the entirety of which is incorporated herein by reference.

FIELD OF THE DISCLOSURE

The present disclosure generally relates to the field of semiconductor manufacturing technology and, more particularly, relates to a semiconductor device and a fabrication method thereof.

BACKGROUND

A fin field effect transistor (FinFET) is one of common multi-gate devices. The FinFET includes a fin disposed on a surface of a semiconductor substrate, an isolation structure covering a portion of the sidewall of the fin, a gate structure disposed over the substrate and across a length portion of the fin, and source and drain regions disposed in the fin on both sides of the gate structure.

To meet the increasing demand for high-capacity semiconductor memory devices, the integration density of semiconductor devices has attracted great attention. To increase the integration density of semiconductor devices, self-aligned double patterning technology (SADP) has been widely used in the device fabrication process of the FinFET. Self-aligned quadruple patterning (SAQP) photolithography technology for fabricating semiconductor devices with substantially small nodes has been proven to provide substantially small process fluctuations.

However, as the size of the semiconductor device continues to decrease and the device density continues to increase, the performance of the formed FinFET is unstable and still needs to be improved. The disclosed methods and device structures are directed to solve one or more problems set forth above and other problems.

BRIEF SUMMARY OF THE DISCLOSURE

One aspect of the present disclosure includes a method for forming a semiconductor device. The method includes providing a substrate, and forming a first core layer on the substrate. The substrate includes a pull-up transistor region. The method also includes forming separately arranged second core layers on the first core layer, and forming a first sacrificial sidewall spacer on a sidewall of a second core layer. A gap is formed between adjacent first sacrificial sidewall spacers over the pull-up transistor region. In addition, the method includes removing the second core layers, and then etching the first core layer using the first sacrificial sidewall spacers as a mask until the substrate is exposed. The gap is transferred to a region between adjacent etched first core layers over the pull-up transistor region. Further, after etching the first core layer, the method includes forming a dielectric layer to fully fill the gap.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

At present, the self-aligned quadruple patterning photolithography technology is used to fabricate a semiconductor device with substantially small nodes. However, the formed semiconductor device has poor performance stability, tends to have leakage and other phenomena, and cannot meet the actual application requirements.

Figure 1:
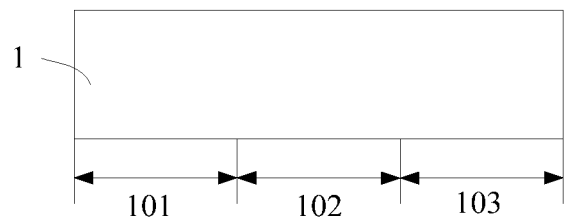
FIGS. 1-6 illustrate semiconductor structures corresponding to certain stages for forming a semiconductor device.
Figure 2:
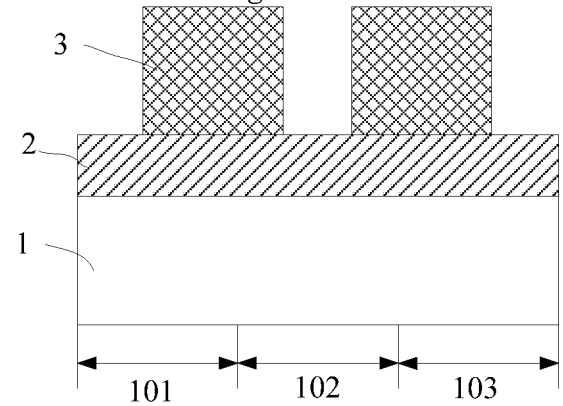
Figure 3:
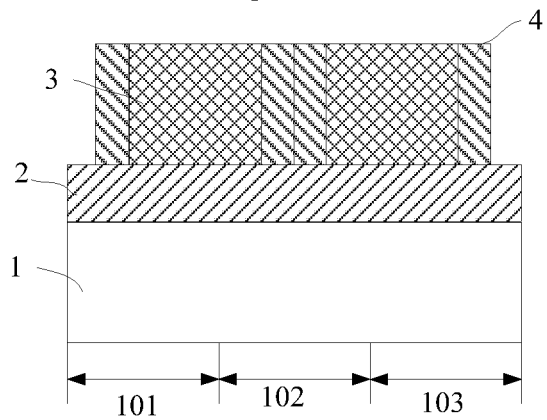
Figure 4:
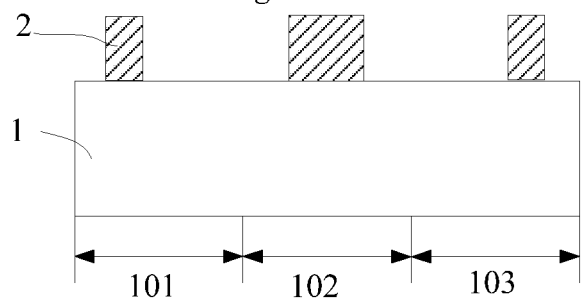
Figure 5:
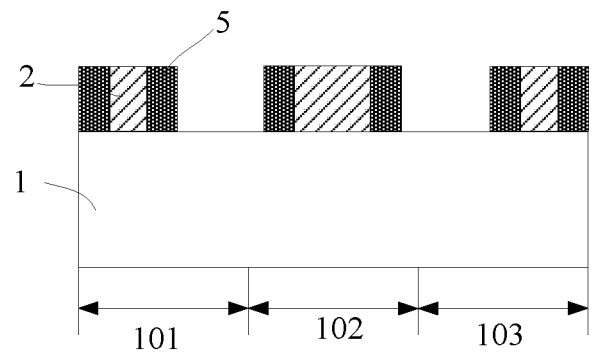
Figure 6:
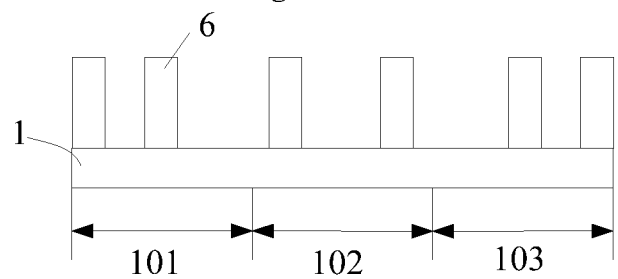

The method for forming the semiconductor device includes following. Referring to FIG. 1, a substrate 1 is provided. The substrate 1 includes a transmission transistor region 101, a pull-up transistor region 102, and a pull-down transistor region 103. Referring to FIG. 2, a first core layer 2 is formed on the substrate 1, and a plurality of separately arranged second core layers 3 are formed on the first core layer 2. Referring to FIG. 3, a first sacrificial sidewall spacer 4 is formed on a sidewall of the second core layer 3. Referring to FIG. 4, the second core layers 3 are removed, and the first core layer 2 is etched using the first sacrificial sidewall spacer 4 as a mask. Then, the first sacrificial sidewall spacer 4 is removed. Referring to FIG. 5, a second sacrificial sidewall spacer 5 is formed on a sidewall of etched first core layer 2. Referring to FIG. 6, the first core layer 2 is removed, and a portion of the substrate 1 along a thickness direction is etched using the second sacrificial sidewall spacer 5 as a mask to form a plurality of discretely arranged fins 6 on the substrate 1. Then, the second sacrificial sidewall spacer 5 is removed.

The performance stability of the semiconductor device formed by such method is poor, and leakage, short-circuit and other phenomena tend to occur, which limit the application of the semiconductor device. Because the first sacrificial sidewall spacer just fills a region between adjacent second core layers disposed over the pull-up transistor region, when subsequently forming fins in the pull-up transistor region, a distance between adjacent fins is small. When forming epitaxial layers, adjacent epitaxial layers tend to merge together, and the isolation effect between adjacent epitaxial layers is poor. Therefore, a leakage phenomenon occurs when the semiconductor device is used. At the same time, if a gap is formed between first sacrificial sidewall spacers to increase the distance between adjacent fins in the pull-up transistor region, an excess fin is subsequently formed on the substrate corresponding to the gap, causing the formed pattern to be inaccurate. The formed excess fin desires to be removed, and the process is complicated, which easily brings damages to the fins that have already been formed, and does not effectively improve the quality of the formed semiconductor device.

The present disclosure provides a semiconductor device and a method for forming the semiconductor device. A gap formed between adjacent first sacrificial sidewall spacers disposed over the pull-up transistor region may be used to increase the distance between adjacent fins over the pull-up transistor region, which may eliminate the leakage phenomenon of the formed semiconductor device. Because the distance between the adjacent fins over the pull-up transistor region increases, when forming epitaxial layers, the distance between adjacent epitaxial layers may be sufficiently large, such that the adjacent epitaxial layers may not merge together. In view of this, the epitaxial layers may have desired isolation effect. At the same time, to ensure the accuracy of pattern transfer while increasing the distance between adjacent fins over the pull-up transistor region, before forming the fins, a dielectric layer may desire to be formed to fully fill the gap. Thus, when subsequently forming the second sacrificial sidewall spacer, the second sacrificial sidewall spacer may not be formed in the gap. When etching a portion of the substrate along a thickness direction using the second sacrificial sidewall spacer as a mask, an excess fin may not be formed on the substrate corresponding to the gap, such that the pattern of the ultimately formed fins may meet actual demands, which may improve the accuracy of pattern transfer, may simplify the process, and may improve the quality of the formed semiconductor device.

Figure 23:
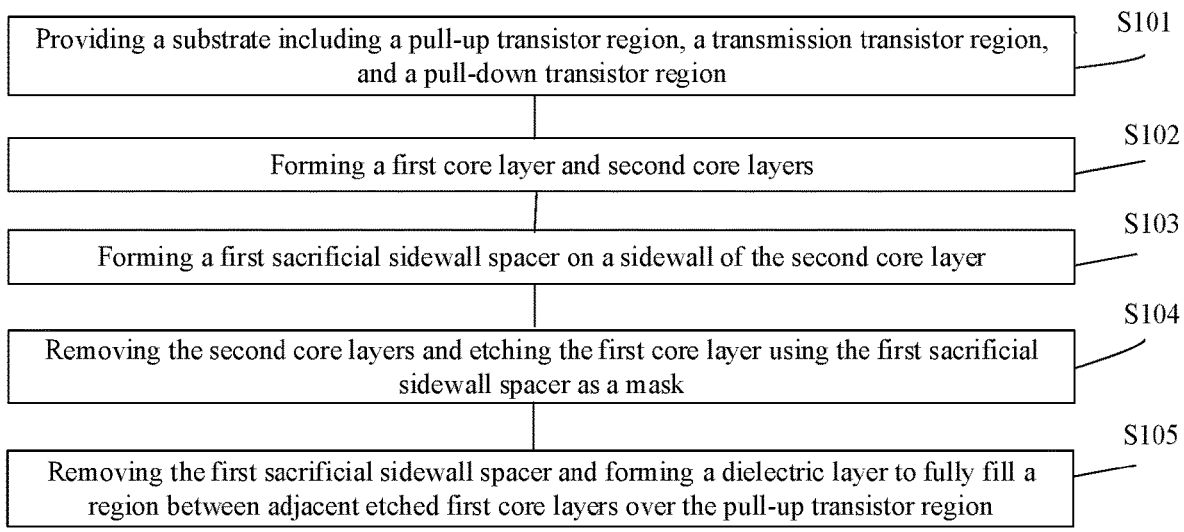
FIG. 23 illustrates an exemplary method for forming a semiconductor device consistent with various disclosed embodiments of the present disclosure.

FIG. 23 illustrates a method for forming a semiconductor device consistent with various disclosed embodiments of the present disclosure, and FIGS. 7-11 illustrate semiconductor structures corresponding to certain stages of the fabrication method.

Figure 7:
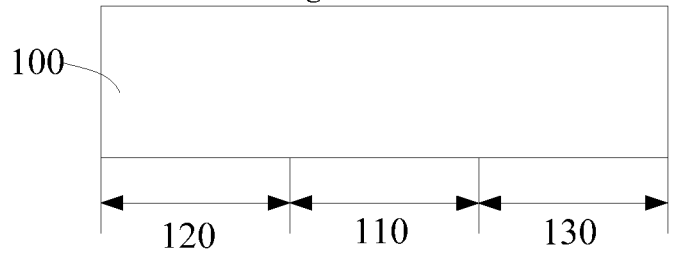
FIGS. 7-11 illustrate semiconductor structures corresponding to certain stages for forming an exemplary semiconductor device consistent with various disclosed embodiments of the present disclosure.

As shown in FIG. 23, at the beginning of the fabrication method, a substrate with certain structures may be provided (S101). FIG. 7 illustrates a corresponding semiconductor structure.

Referring to FIG. 7, a substrate 100 may be provided. The substrate 100 may include a pull-up transistor region 110, a transmission transistor region 120, and a pull-down transistor region 130.

In one embodiment, the substrate 100 may be made of monocrystalline silicon. In another embodiment, the substrate 100 may be made of monocrystalline silicon, polysilicon, or amorphous silicon. In certain embodiments, the substrate 100 may be made of silicon, germanium, silicon germanium, gallium arsenide, and any other semiconductor material.

Figure 8:
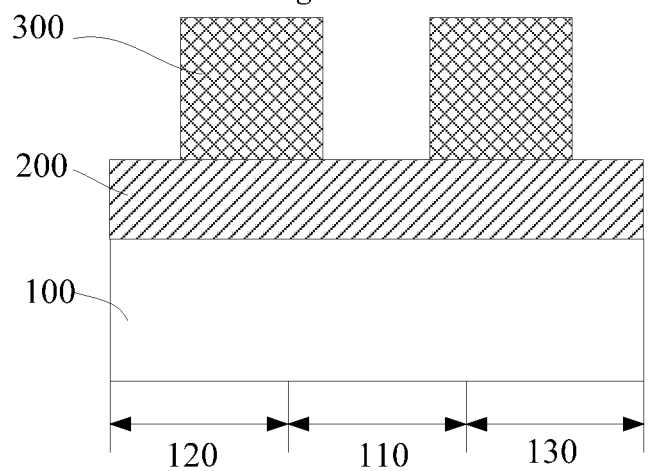

Returning to FIG. 23, after providing the substrate, a first core layer and second core layers may be formed (S102). FIG. 8 illustrates a corresponding semiconductor structure.

Referring to FIG. 8, a first core layer 200 may be formed on the substrate 100, and separately arranged second core layers 300 may be formed on the first core layer 200.

In one embodiment, the first core layer 200 may be made of amorphous silicon. In another embodiment, the first core layer 200 may be made of any one of amorphous silicon, amorphous carbon, silicon nitride, and silicon oxide. In certain embodiments, the first core layer 200 may be made of a combination of amorphous silicon and amorphous carbon, or a combination of amorphous carbon and silicon nitride, etc.

In one embodiment, the first core layer 200 may be formed on the substrate 100 by an atomic layer vapor deposition method. In another embodiment, the first core layer 200 may be formed by a chemical vapor deposition method or a physical vapor deposition method.

In one embodiment, the second core layer 300 may be made of a same material, e.g., amorphous silicon, as the first core layer 200. In another embodiment, the second core layer 300 may be made of a material different from the first core layer 200.

In one embodiment, the second core layer 300 may be made of amorphous silicon. In another embodiment, the second core layer 300 may be made of a combination of amorphous silicon and amorphous carbon, or a combination of silicon nitride and silicon oxide.

In one embodiment, a material layer of the second core layer 300 may be first deposited on the first core layer 200, and then the material layer of the second core layer 300 may be back-etched to form the separately arranged second core layers 300 on the first core layer 200.

Figure 9:
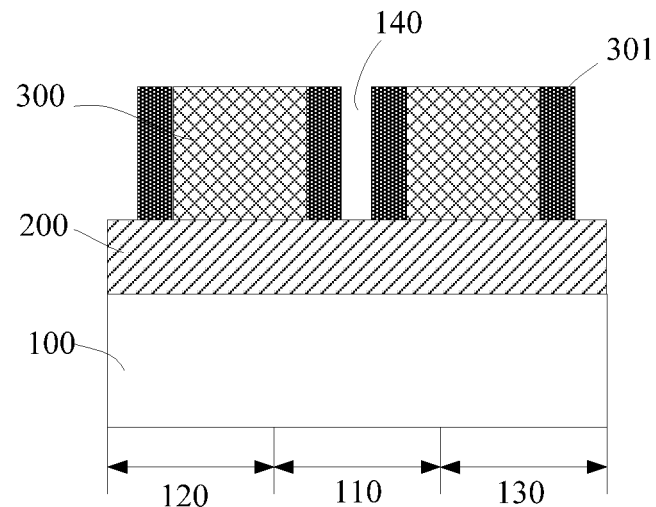

Returning to FIG. 23, after forming the first core layer and the second core layers, a first sacrificial sidewall spacer may be formed (S103). FIG. 9 illustrates a corresponding semiconductor structure.

Referring to FIG. 9, a first sacrificial sidewall spacer 301 may be formed on a sidewall of the second core layer 300. A gap 140 may be formed between adjacent first sacrificial sidewall spacers 301 over the pull-up transistor region 110.

In one embodiment, the first sacrificial sidewall spacer 301 may be made of silicon nitride. In another embodiment, the first sacrificial sidewall spacer 301 may be made of a combination of silicon nitride and silicon oxynitride, a combination of silicon oxide and silicon oxynitride, a combination of silicon carbide and silicon oxynitride, or a combination of silicon and metal oxide, etc.

In one embodiment, a material of the first sacrificial sidewall spacer 301 may be first deposited over the first core layer 200 and the second core layers 300 by a chemical vapor deposition method, and then the material of the first sacrificial sidewall spacer 301 may be back-etched to form the first sacrificial sidewall spacer 301 on the sidewall of the second core layer 300.

In one embodiment, the material of the first sacrificial sidewall spacer 301 may be dry-etched. Process parameters of the dry-etching may include: gases including $CF_4$ gas having a flow rate in a range of approximately 5 sccm-100 sccm, $CH_3F$ gas having a flow rate in a range of approximately 8 sccm-50 sccm, and $O_2$ gas having a flow rate in a range of approximately 10 sccm-100 sccm; a chamber pressure in a range of approximately 10 mTorr-2000 mTorr; a RF power in a range of approximately 50 W-300 W; a bias voltage in a range of approximately 30 V-100 V, and a time length in a range of approximately 4 seconds-50 seconds.

In one embodiment, because the gap 140 is formed between adjacent first sacrificial sidewall spacers 301 over the pull-up transistor region 110, when subsequently forming fins over the pull-up transistor region 110, the distance between adjacent fins may increase. In view of this, when forming epitaxial layers, there may be a sufficiently large spacing between adjacent epitaxial layers over the pull-up transistor region 110, the adjacent epitaxial layers may be prevented from being merged together, and may have a desired isolation effect. Therefore, the probability of occurring leakage phenomenon during the application of the semiconductor device may be reduced, and the performance of the semiconductor device may be improved.

Figure 10:
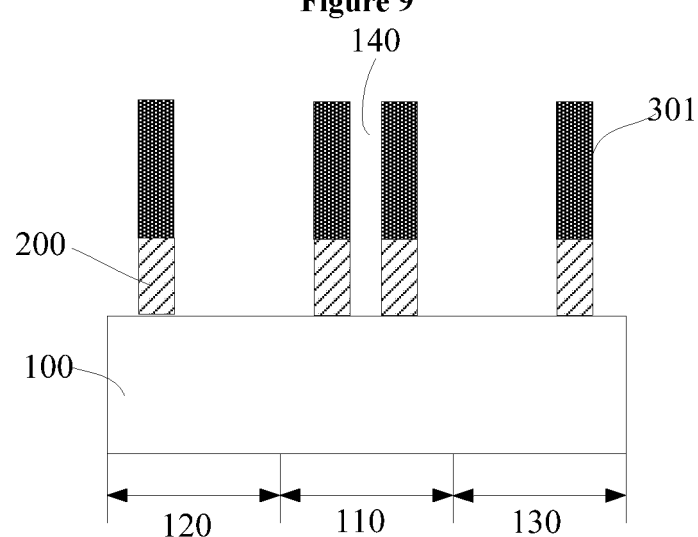

Returning to FIG. 23, after forming the first sacrificial sidewall spacer, the second core layers may be removed and the first core layer may be etched (S104). FIG. 10 illustrates a corresponding semiconductor structure.

Referring to FIG. 10, the second core layers 300 may be removed, and the first core layer 200 may be etched using the first sacrificial sidewall spacer 301 as a mask until the substrate 100 is exposed. The gap 140 may be transferred to a region between adjacent etched first core layers 200 over the pull-up transistor region 110.

In one embodiment, the second core layers 300 may be removed by a dry etching process. In another embodiment, the second core layer 300 may be removed by an ashing process.

In one embodiment, the first core layer 200 may be dry-etched. Process parameters of dry-etching may include etching gases including HBr having a flow rate in a range of approximately 10 sccm-1000 sccm, and Ar having a flow rate in a range of approximately 10 sccm-1000 sccm.

Figure 11:
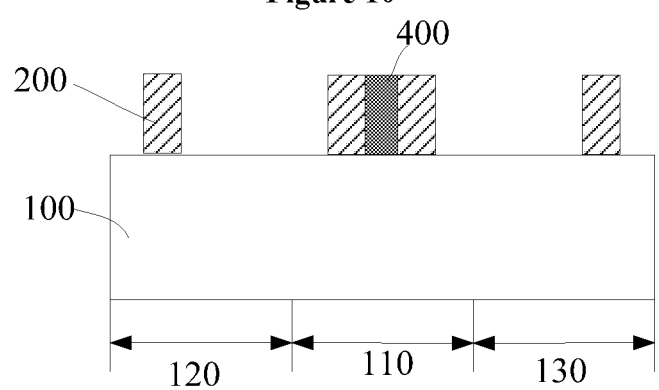

Returning to FIG. 23, after etching the first core layer, the first sacrificial sidewall spacer may be removed and a dielectric layer may be formed (S105). FIG. 11 illustrates a corresponding semiconductor structure.

Referring to FIG. 11, the first sacrificial sidewall spacer 301 may be removed, and a dielectric layer 400 may be formed to fully fill the gap 140. In one embodiment, the dielectric layer 400 may be made of silicon oxide. In another embodiment, the dielectric layer 400 may be made of any other silicon oxide compound.

In one embodiment, a dielectric material layer may be first formed on the exposed substrate 100 and the etched first core layer 200 by an atomic layer deposition method. Then, the dielectric material layer may be back-etched, and merely the dielectric material layer in the gap 140 may be retained to form the dielectric layer 400.

In one embodiment, detailed parameters of the atomic layer deposition method may include an organic gas containing Si and O, a temperature in a range of approximately 80° C.-300° C., a pressure in a range of approximately 5 mTorr-20 Torr, and a number of process times in a range of approximately 5-100.

In one embodiment, the dielectric material layer formed by the atomic layer deposition method may have desired density and uniformity, which may facilitate improving the performance of the formed semiconductor device.

In one embodiment, the process of back-etching the dielectric material layer may include a wet etching process. In another embodiment, the back-etching process of the dielectric material layer may include a dry etching process.

In one embodiment, process parameters of the wet etching process may include a temperature in a range of approximately 25° C.-300° C., and HCl gas having a volume percentage in a range of approximately 20%-90%.

In one embodiment, the gap 140 may be formed between adjacent first sacrificial sidewall spacers 301 over the pull-up transistor region 110. When subsequently forming the fins by etching, the distance between adjacent fins over the pull-up transistor region 110 may increase. Therefore, when forming the epitaxial layers, the adjacent epitaxial layers over the pull-up transistor region 110 may not be merged together. Therefore, the formed semiconductor device may not have leakage, or short-circuit phenomena, which may improve the service life of the formed semiconductor device. However, because the gap 140 is formed between adjacent first sacrificial sidewall spacers 301 over the pull-up transistor region 110, the gap 140 may desire to be fully filled with the dielectric layer 400 to ensure that when subsequently forming the second sacrificial sidewall spacer, the second sacrificial sidewall spacer may not be formed in the gap 140. In view of this, when etching a portion of the substrate along the thickness direction using the second sacrificial sidewall spacer as a mask, a fin may not be formed on the substrate corresponding to the gap 140, such that the ultimately formed pattern of fins may meet actual demands. Therefore, the manufacturing process may be simplified while ensuring the accuracy of the formed pattern.

The present disclosure further provides a semiconductor device formed by the method in any of disclosed embodiments. The semiconductor device may include a substrate 100 including a pull-up transistor region 110, a transmission transistor region 120, and a pull-down transistor region 130. The semiconductor device may also include first core layers 200 separately disposed on the substrate 100. Further, the semiconductor device may include a dielectric layer 400 fully filling a gap between adjacent first core layers 200 over the pull-up transistor region 110.

Figure 24:
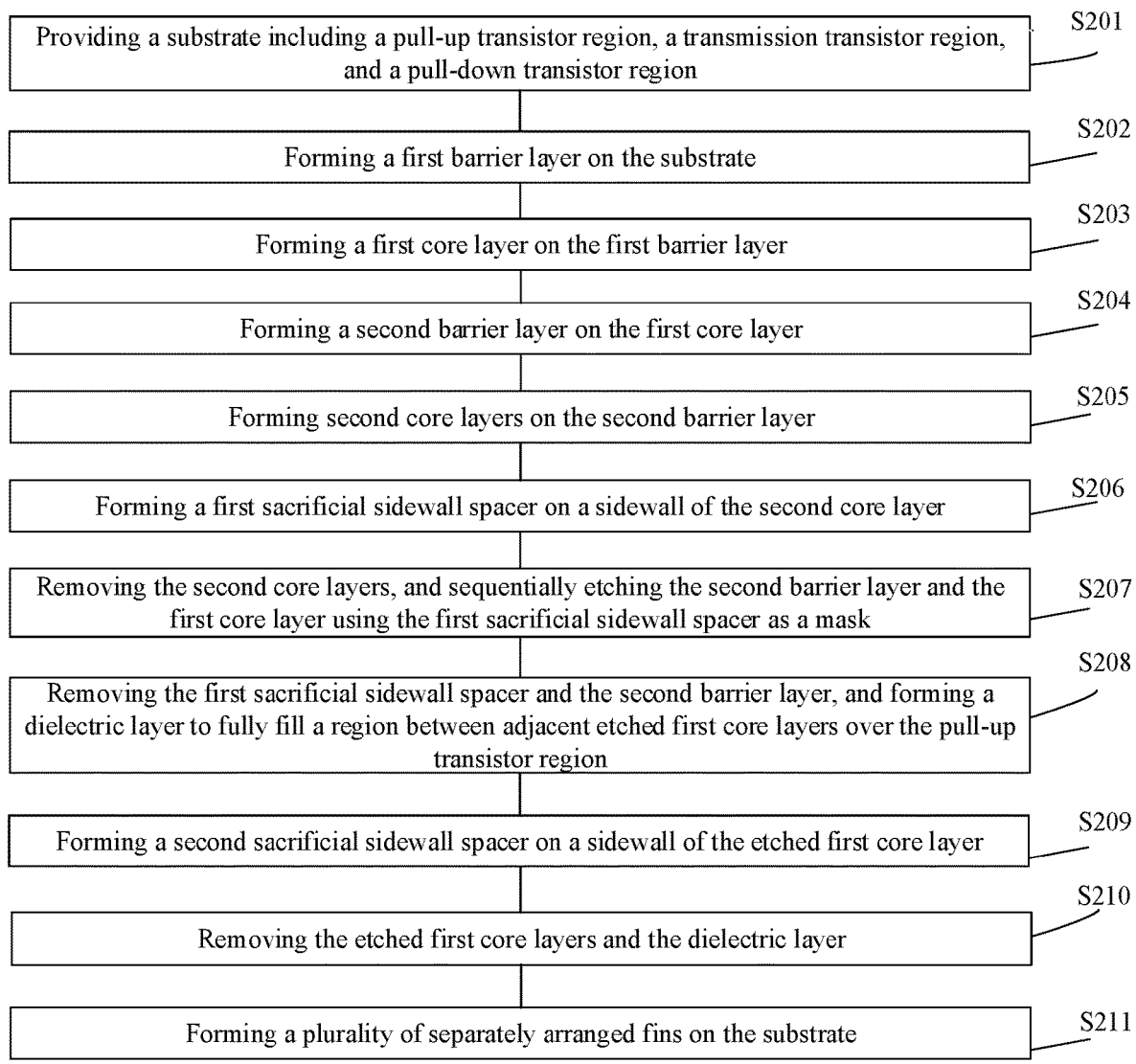
FIG. 24 illustrates another exemplary method for forming a semiconductor device consistent with various disclosed embodiments of the present disclosure.

FIG. 24 illustrates another method for forming a semiconductor device consistent with various disclosed embodiments of the present disclosure, and FIGS. 12-22 illustrate semiconductor structures corresponding to certain stages of the fabrication method.

Figure 12:
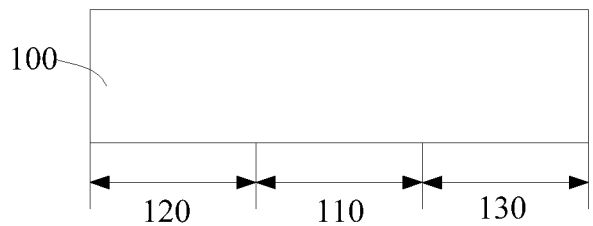
FIGS. 12-22 illustrate semiconductor structures corresponding to certain stages for forming another exemplary semiconductor device consistent with various disclosed embodiments of the present disclosure.

As shown in FIG. 24, at the beginning of the fabrication method, a substrate with certain structures may be provided (S201). FIG. 12 illustrates a corresponding semiconductor structure.

Referring to FIG. 12, a substrate 100 may be provided. The substrate 100 may include a pull-up transistor region 110, a transmission transistor region 120, and a pull-down transistor region 130.

In one embodiment, the substrate 100 may be made of monocrystalline silicon. In another embodiment, the substrate 100 may be made of silicon, germanium, silicon germanium, gallium arsenide, and any other semiconductor material.

Figure 13:
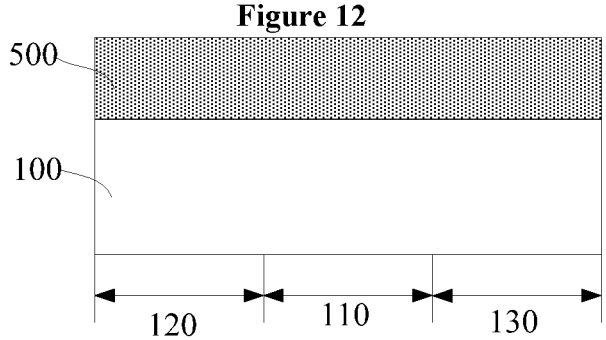

Returning to FIG. 24, after providing the substrate, a first barrier layer may be formed (S202). FIG. 13 illustrates a corresponding semiconductor structure.

Referring to FIG. 13, a first barrier layer 500 may be formed on the substrate 100. In one embodiment, the first barrier layer 500 may be made of silicon nitride. In another embodiment, the first barrier layer 500 may be made of one or more of silicon nitride, silicon oxide, and silicon carbide.

In one embodiment, the first barrier layer 500 may be formed on the substrate 100 by an atomic layer deposition method. In another embodiment, the first barrier layer 500 may be formed on the substrate 100 by a chemical vapor deposition method or a plasma vapor deposition method.

In one embodiment, the first barrier layer 500 may be formed on the substrate 100 to protect the surface of the substrate 100 from being damaged in subsequent etching processes, and to ensure that when subsequently forming fins, the surface of the fin may have a substantially high quality to ensure the accuracy of patterning.

Figure 14:
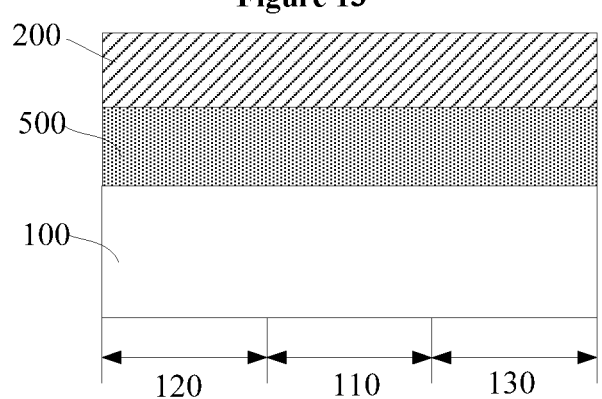

Returning to FIG. 24, after forming the first barrier layer, a first core layer may be formed (S203). FIG. 14 illustrates a corresponding semiconductor structure.

Referring to FIG. 14, a first core layer 200 may be formed on the first barrier layer 500. The material and formation method of the first core layer 200 may refer to related descriptions associated with FIG. 8, which are not repeated herein.

Figure 15:
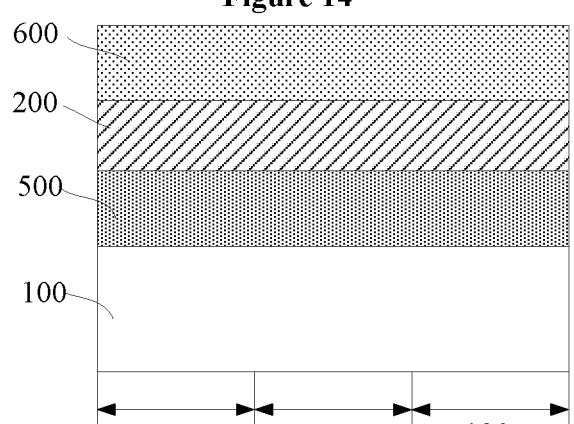

Returning to FIG. 24, after forming the first core layer, a second barrier layer may be formed (S204). FIG. 15 illustrates a corresponding semiconductor structure.

Referring to FIG. 15, a second barrier layer 600 may be formed on the first core layer 200. In one embodiment, the second barrier layer 600 may be made of silicon nitride. In another embodiment, the second barrier layer 600 may be made of a material including a combined stacked structure of silicon nitride and silicon oxide, a combined stacked structure of silicon oxide and silicon carbide, or a single layer of silicon oxide or silicon carbide, etc.

In one embodiment, the second barrier layer 600 may be formed on the first core layer 200 by an atomic layer deposition method. In another embodiment, the second barrier layer 600 may be formed on the first core layer 200 by a chemical vapor deposition method, or a plasma vapor deposition method.

In one embodiment, the second barrier layer 600 may be formed on the first core layer 200 to protect the quality of the surface of the first core layer 200, and to ensure that the formed pattern is accurately transferred during the transfer process. The pattern may be prevented from being deviated during the transfer process, and, thus, the performance of the formed semiconductor device may not be affected.

Figure 16:
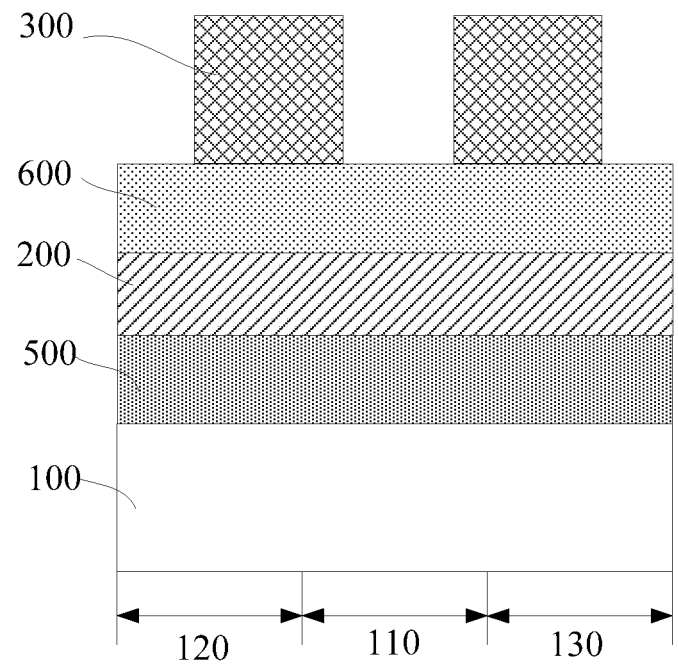

Returning to FIG. 24, after forming the second barrier layer, second core layers may be formed (S205). FIG. 16 illustrates a corresponding semiconductor structure.

Referring to FIG. 16, separately arranged second core layers 300 may be formed on the second barrier layer 600. The material and formation method of the second core layers 300 may refer to related descriptions associated with FIG. 8, which are not repeated herein.

Figure 17:
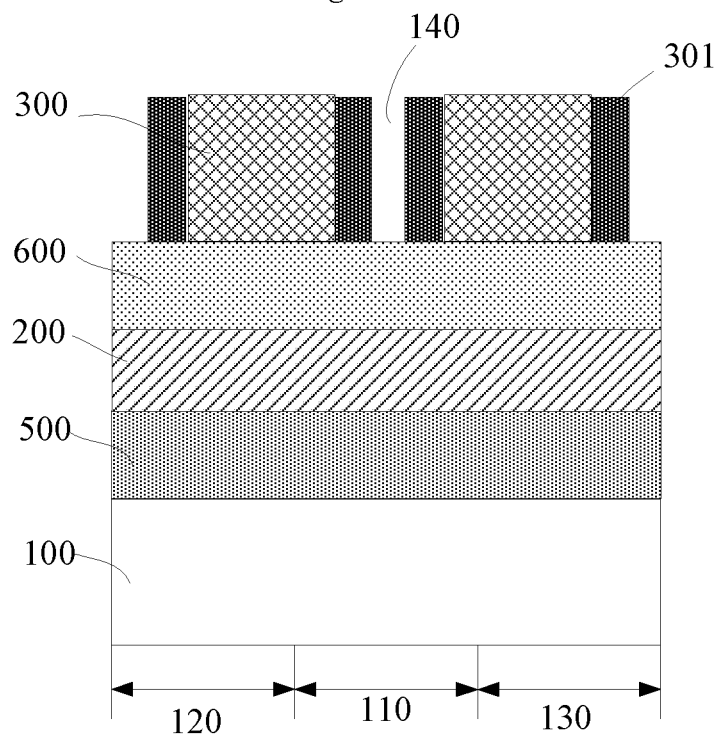

Returning to FIG. 24, after forming the second core layers, a first sacrificial sidewall spacer may be formed (S206). FIG. 17 illustrates a corresponding semiconductor structure.

Referring to FIG. 17, a first sacrificial sidewall spacer 301 may be formed on a sidewall of the second core layer 300. A gap 140 may be formed between adjacent first sacrificial sidewall spacers 301 over the pull-up transistor region 110. The material and formation method of the first sacrificial sidewall spacer 301 may refer to related descriptions associated with FIG. 9, which are not repeated herein.

Figure 17A:
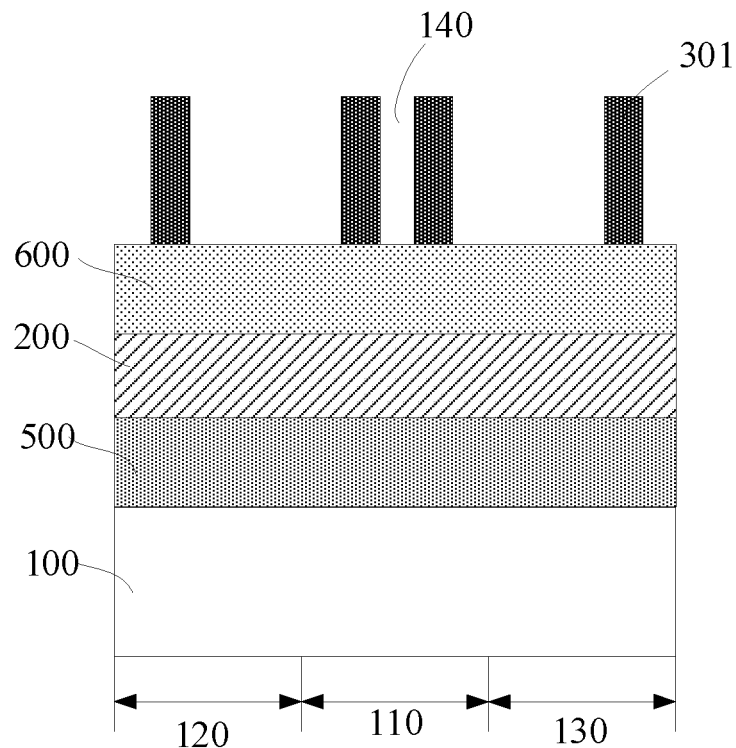
Figure 18:
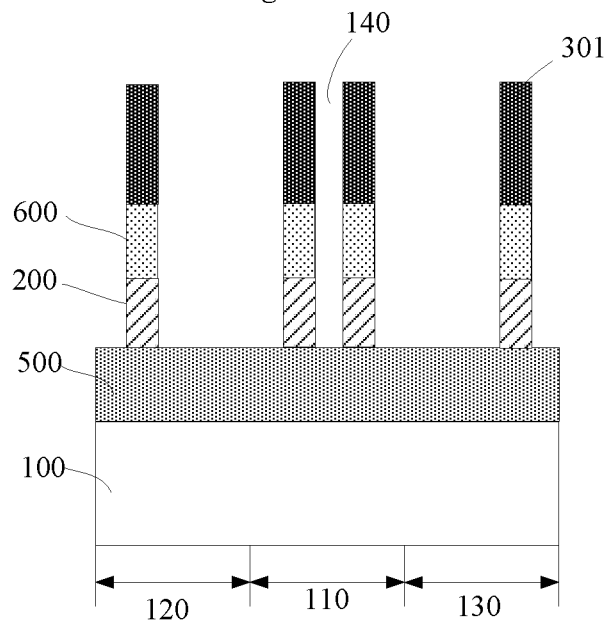

Returning to FIG. 24, after forming the first sacrificial sidewall spacer, the second core layers may be removed, and the second barrier layer and the first core layer may be sequentially etched (S207) as shown in FIG. 17A. FIG. 18 illustrates a corresponding semiconductor structure Referring to FIG. 18, the second core layers 300 may be removed, and the second barrier layer 600 and the first core layer 200 may be sequentially etched using the first sacrificial sidewall spacer 301 as a mask until the first barrier layer 500 is exposed. The gap 140 may be transferred to a region between adjacent etched first core layers 200 over the pull-up transistor region 110.

In one embodiment, the second barrier layer 600 and the first core layer 200 may be dry-etched. Detailed process parameters of dry-etching may include a mixed gas including an etching gas and a diluent gas, where the etching gas may include HCl, the diluent gas may include $N_2$, and molar percentage of the etching gas in the mixed gas may be in a range of approximately 20%-90%; and a temperature in a range of approximately 100° C.-200° C., e.g., 150° C.

Figure 19:
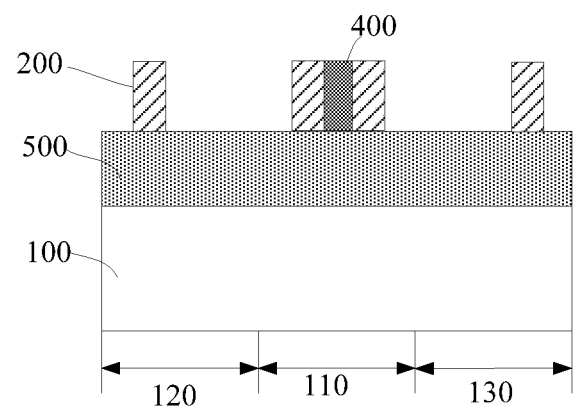

Returning to FIG. 24, after etching the second barrier layer and the first core layer, a dielectric layer may be formed (S208). FIG. 19 illustrates a corresponding semiconductor structure.

Referring to FIG. 19, the first sacrificial sidewall spacer 301 and the second barrier layer 600 may be removed, and a dielectric layer 400 may be formed to fully fill the gap 140. In one embodiment, the first sacrificial sidewall spacer 301 and the second barrier layer 600 may be removed by a dry etching process. In another embodiment, the first sacrificial sidewall spacer 301 and the second barrier layer 600 may be removed by a chemical mechanical polishing process or an ashing process, etc.

The present disclosure further provides a semiconductor device formed by the method in any of disclosed embodiments. The semiconductor device may include a substrate 100 including a pull-up transistor region 110, a transmission transistor region 120, and a pull-down transistor region 130. The semiconductor device may also include a first barrier layer 500 disposed on the substrate 100, and first core layers 200 separately disposed on the first barrier layer 500. Further, the semiconductor device may include a dielectric layer 400 fully filling a gap between adjacent first core layers 200 over the pull-up transistor region 110.

Figure 20:
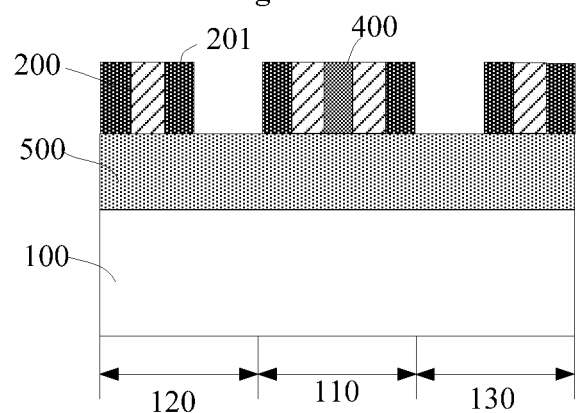

Returning to FIG. 24, after forming the dielectric layer, a second sacrificial sidewall spacer may be formed (S209). FIG. 20 illustrates a corresponding semiconductor structure.

Referring to FIG. 20, a second sacrificial sidewall spacer 201 may be formed on a sidewall of the etched first core layer 200. In one embodiment, the second sacrificial sidewall spacer 201 may be made of a combination of silicon nitride and silicon oxide. In another embodiment, the second sacrificial sidewall spacer 201 may be made of a combination of silicon nitride and silicon oxynitride, a combination of silicon oxide and silicon oxynitride, a combination of silicon carbide and silicon oxynitride, a combination of silicon and metal oxide, or a single layer of silicon nitride, silicon oxide, or silicon carbide, etc.

Figure 21:
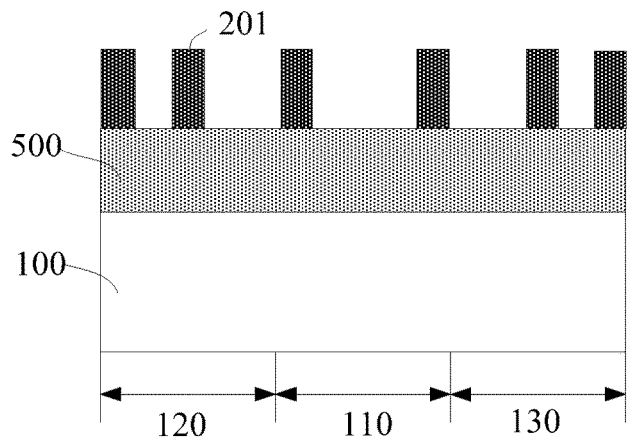

Returning to FIG. 24, after forming the second sacrificial sidewall spacer, the etched first core layers and the dielectric layer may be removed (S210). FIG. 21 illustrates a corresponding semiconductor structure.

Referring to FIG. 21, the etched first core layers 200 and the dielectric layer 400 may be removed. In one embodiment, the etched first core layers 200 and the dielectric layer 400 may be removed by a dry etching process or using a Tetramethylammonium hydroxide (TMAH) etching solution.

Figure 22:
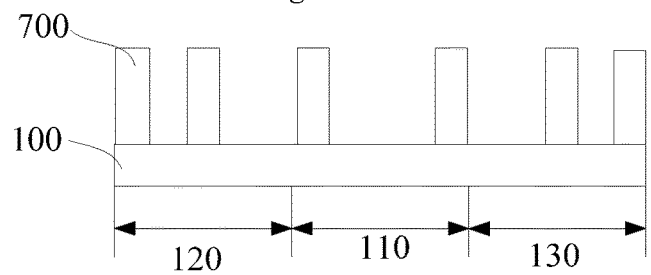

Returning to FIG. 24, after removing the etched first core layers and the dielectric layer, a plurality of fins may be formed (S211). FIG. 22 illustrates a corresponding semiconductor structure.

Referring to FIG. 22, using the second sacrificial sidewall spacer 201 as a mask, the first barrier layer 500 and a portion of the substrate 100 along a thickness direction may be sequentially etched, to form a plurality of separately arranged fins 700 on the substrate 100. The second sacrificial sidewall spacer 201 and the first barrier layer 500 may be removed.

In one embodiment, because the dielectric layer 400 fully fills the gap 140, when forming the second sacrificial sidewall spacer 201, the second sacrificial sidewall spacer 201 may not be formed in the gap 140. In view of this, by using the second sacrificial sidewall spacer 201 as a mask, when etching the first barrier layer 500 and a portion of the substrate 100 along the thickness direction to form the plurality of separately arranged fins 700 on the substrate 100, an excess fin may not be formed on the substrate 100 corresponding to the gap 140, which may ensure the accuracy of the formed pattern, and may simplify the process flow.

Accordingly, in the disclosed semiconductor device, the gap may be formed between adjacent first sacrificial sidewall spacers over the pull-up transistor region. When subsequently forming fins over the pull-up transistor region, the distance between adjacent fins may increase. Therefore, when subsequently forming the epitaxial layers, adjacent epitaxial layers over the pull-up transistor region may not be merged together. In view of this, the epitaxial layer may have desired isolation effect, and, thus, the formed semiconductor device may not have a leakage phenomenon, which may improve the service life of the semiconductor device. At the same time, because the gap is formed between adjacent first sacrificial sidewall spacers over the pull-up transistor region, the dielectric layer may desire to fully fill the gap. When subsequently forming the plurality of separately arranged fins on the substrate by etching a portion of the substrate along the thickness direction using the second sacrificial sidewall spacer as a mask, because the gap is filled by the dielectric layer, the second sacrificial sidewall spacer may not be formed in the gap, therefore an excess fin may not be formed on the substrate corresponding to the gap, and the pattern of the ultimately formed fin may meet actual demands.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for forming a semiconductor device, comprising:
   providing a substrate, wherein the substrate includes a pull-up transistor region, a transmission transistor region, and a pull-down transistor region, and the pull-up transistor region is located between the transmission transistor region and the pull-down transistor region;
   forming a first core layer on the substrate;
   forming second core layers separately arranged on the first core layer;
   forming a first sacrificial sidewall spacer on a sidewall of the second core layers, wherein a first gap is formed between adjacent first sacrificial sidewall spacers over the pull-up transistor region;
   removing the second core layers;
   after removing the second core layers, etching the first core layer using the first sacrificial sidewall spacers as a mask, wherein a second gap is formed under the first gap over the pull-up transistor region; and
   after etching the first core layer, forming a dielectric layer to fully fill the second gap only over the pull-up transistor region of the substrate.

2. The method according to claim 1, before forming the dielectric layer, further including:
   removing the first sacrificial sidewall spacer.

3. The method according to claim 2, after forming the dielectric layer, further including:
   forming a second sacrificial sidewall spacer on a sidewall of a remaining portion of the first core layer;
   after forming the second sacrificial sidewall spacer, removing the remaining portion of the first core layer and the dielectric layer;
   after removing the remaining portion of the first core layer and the dielectric layer, forming a plurality of separately arranged fins on the substrate by etching a portion of the substrate along a thickness direction using the second sacrificial sidewall spacer as a mask; and
   after forming the plurality of separately arranged fins, removing the second sacrificial sidewall spacer.

4. The method according to claim 3, before forming the first core layer, further including:
   forming a first barrier layer on a surface of the substrate.

5. The method according to claim 4, wherein:
   the first barrier layer is made of a material including one or more of silicon nitride, silicon oxide, and silicon carbide.

6. The method according to claim 3, before forming the second core layers, further including:
   forming a second barrier layer on a surface of the first core layer.

7. The method according to claim 6, wherein:
   the second barrier layer is made of a material including one or more of silicon nitride, silicon oxide, and silicon carbide.

8. The method according to claim 3, wherein:
   the second sacrificial sidewall spacer is made of a material including one or more of silicon nitride, silicon oxide, and silicon oxynitride.

9. The method according to claim 1, wherein:
   the first core layer is made of a material including one or more of amorphous silicon, amorphous carbon, silicon nitride, and silicon oxide.

10. The method according to claim 1, wherein:
    the second core layers are made of a material including one or more of amorphous silicon, amorphous carbon, silicon nitride, and silicon oxide.

11. The method according to claim 1, wherein forming the dielectric layer includes:
    forming a dielectric material layer by an atomic layer deposition; and
    back-etching the dielectric material layer.

12. The method according to claim 1, wherein:
    the first sacrificial sidewall spacer is made of a material including one or more of silicon nitride, silicon oxide, and silicon oxynitride.

13. The method according to claim 1, wherein:
    the first core layer is made of a same material as the second core layers.

14. The method according to claim 1, wherein:
    the first core layer is made of a material different from the second core layers.

15. The method according to claim 1, wherein:
    the dielectric layer is made of a material including silicon oxide.

* * * * *